United States Patent
Campbell et al.

(10) Patent No.: US 8,059,405 B2
(45) Date of Patent: Nov. 15, 2011

(54) CONDENSER BLOCK STRUCTURES WITH CAVITIES FACILITATING VAPOR CONDENSATION COOLING OF COOLANT

(75) Inventors: Levi A. Campbell, Poughkeepsie, NY (US); Richard C. Chu, Poughkeepsie, NY (US); Michael J. Ellsworth, Jr., Poughkeepsie, NY (US); Madhusudan K. Iyengar, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 201 days.

(21) Appl. No.: 12/491,293

(22) Filed: Jun. 25, 2009

(65) Prior Publication Data

US 2010/0328891 A1    Dec. 30, 2010

(51) Int. Cl.
*H05K 7/20* (2006.01)
*F28F 3/08* (2006.01)
*F28D 15/00* (2006.01)

(52) U.S. Cl. ... 361/700; 361/702; 361/703; 361/679.53; 165/104.33

(58) Field of Classification Search ............ 361/679.53, 361/700, 702, 703; 165/104.33, 166
See application file for complete search history.

(56) References Cited

U.S. PATENT DOCUMENTS

| | | | |
|---|---|---|---|
| 2,643,282 A | | 6/1953 | Greene |
| 2,942,165 A | | 6/1960 | Jackson et al. |
| 3,109,485 A | | 11/1963 | Fortier |
| 3,222,580 A | | 12/1965 | Curll |
| 3,616,533 A | * | 11/1971 | Heap et al. ............... 29/837 |
| 4,064,300 A | | 12/1977 | Bhangu |
| 4,108,242 A | | 8/1978 | Searight et al. |
| 4,201,195 A | | 5/1980 | Sakhuja |
| 4,323,914 A | * | 4/1982 | Berndlmaier et al. ....... 257/713 |
| 4,622,946 A | | 11/1986 | Hurley et al. |

(Continued)

FOREIGN PATENT DOCUMENTS

JP    8-254512 A    10/1996

(Continued)

OTHER PUBLICATIONS

Notice of Allowance for U.S. Appl. No. 12/491,281 (U.S. Patent Publication No. 2010/0328889 A1), dated Feb. 11, 2011.

(Continued)

*Primary Examiner* — Anatoly Vortman
(74) *Attorney, Agent, or Firm* — Dennis Jung, Esq.; Kevin P. Radigan, Esq.; Heslin Rothenberg Farley & Mesiti P.C

(57) ABSTRACT

Condenser structures and cooling apparatuses are provided which facilitate vapor condensation heat transfer of a coolant employed in cooling an electronic device. The condenser structure includes a thermally conductive condenser block with multiple exposed cavities therein extending from a first main surface towards a second main surface. The condenser block is a monolithic structure, and the first main surface is a coolant vapor condensate formation surface when the condenser structure is operationally facilitating cooling of an electronic device. The exposed cavities extend from the first main surface into the condenser block to increase a condensation surface area of the condenser block, thereby facilitating coolant vapor condensate formation on the condenser block, and thus cooling of the electronic device using a two-phase coolant. The condenser structure also includes coolant-carrying channels for facilitating cooling of the condenser block, and thus vapor condensate formation on the condenser block.

18 Claims, 12 Drawing Sheets

U.S. PATENT DOCUMENTS

| | | | |
|---|---|---|---|
| 4,750,086 A | 6/1988 | Mittal | |
| 4,833,567 A | 5/1989 | Saaski et al. | |
| 5,006,924 A * | 4/1991 | Frankeny et al. | 257/714 |
| 5,063,476 A | 11/1991 | Hamadah et al. | |
| 5,126,919 A | 6/1992 | Yamamoto et al. | |
| 5,168,919 A * | 12/1992 | Berenholz et al. | 165/80.4 |
| 5,183,104 A | 2/1993 | Novotny | |
| 5,220,804 A | 6/1993 | Tilton et al. | |
| 5,308,920 A * | 5/1994 | Itoh | 174/15.2 |
| 5,349,831 A | 9/1994 | Daikiku et al. | |
| 5,351,748 A | 10/1994 | Dagan | |
| 5,411,077 A * | 5/1995 | Tousignant | 165/104.33 |
| 5,508,884 A * | 4/1996 | Brunet et al. | 361/698 |
| 5,608,610 A * | 3/1997 | Brzezinski | 361/704 |
| 5,634,351 A * | 6/1997 | Larson et al. | 62/259.2 |
| 5,718,117 A | 2/1998 | McDunn et al. | |
| 5,720,338 A * | 2/1998 | Larson et al. | 165/46 |
| 5,726,495 A | 3/1998 | Aihara et al. | |
| 5,781,411 A | 7/1998 | Feenstra | |
| 5,854,092 A | 12/1998 | Root et al. | |
| 5,963,425 A | 10/1999 | Chrysler et al. | |
| 6,000,908 A | 12/1999 | Bunker | |
| 6,134,108 A | 10/2000 | Patel et al. | |
| 6,134,783 A | 10/2000 | Bargman et al. | |
| 6,193,905 B1 | 2/2001 | Yamada et al. | |
| 6,237,223 B1 * | 5/2001 | McCullough | 29/890.032 |
| 6,366,462 B1 | 4/2002 | Chu et al. | |
| 6,378,605 B1 | 4/2002 | Kutscher et al. | |
| 6,431,260 B1 | 8/2002 | Agonafer et al. | |
| 6,474,074 B2 * | 11/2002 | Ghoshal | 62/3.7 |
| 6,490,160 B2 * | 12/2002 | Dibene et al. | 361/700 |
| 6,519,151 B2 | 2/2003 | Chu et al. | |
| 6,549,408 B2 | 4/2003 | Berchowitz | |
| 6,550,263 B2 | 4/2003 | Patel et al. | |
| 6,550,531 B1 * | 4/2003 | Searls et al. | 165/104.33 |
| 6,571,569 B1 | 6/2003 | Rini et al. | |
| 6,817,196 B2 | 11/2004 | Malone et al. | |
| 6,817,405 B2 | 11/2004 | Kamath et al. | |
| 6,918,435 B2 | 7/2005 | Dwyer | |
| 6,926,071 B2 | 8/2005 | Lee et al. | |
| 6,938,678 B1 | 9/2005 | Bortolini et al. | |
| 6,938,680 B2 * | 9/2005 | Garner et al. | 165/104.26 |
| 6,992,888 B1 * | 1/2006 | Iyer | 361/699 |
| 7,077,189 B1 * | 7/2006 | Reyzin et al. | 165/80.4 |
| 7,079,393 B2 | 7/2006 | Colgan et al. | |
| 7,134,289 B2 | 11/2006 | Patel et al. | |
| 7,254,030 B2 * | 8/2007 | Chiba et al. | 361/710 |
| 7,284,389 B2 | 10/2007 | Sharma et al. | |
| 7,307,841 B2 | 12/2007 | Berlin et al. | |
| 7,349,213 B2 | 3/2008 | Campbell et al. | |
| 7,357,173 B2 | 4/2008 | Griesmayer | |
| 7,362,574 B2 | 4/2008 | Campbell et al. | |
| 7,365,981 B2 * | 4/2008 | Myers et al. | 361/699 |
| 7,369,410 B2 * | 5/2008 | Chen et al. | 361/701 |
| 7,375,962 B2 | 5/2008 | Campbell et al. | |
| 7,380,409 B2 | 6/2008 | Campbell et al. | |
| 7,450,385 B1 | 11/2008 | Campbell et al. | |
| 7,477,513 B1 | 1/2009 | Cader et al. | |
| 7,495,914 B2 | 2/2009 | Tilton et al. | |
| 7,522,422 B2 * | 4/2009 | Chiba et al. | 361/710 |
| 2001/0006101 A1 | 7/2001 | Chu et al. | |
| 2002/0062945 A1 | 5/2002 | Hocker et al. | |
| 2002/0118511 A1 * | 8/2002 | Dujari et al. | 361/703 |
| 2003/0205363 A1 * | 11/2003 | Chu et al. | 165/80.3 |
| 2004/0246683 A1 | 12/2004 | Honsberg-Riedl et al. | |
| 2006/0039111 A1 * | 2/2006 | Huang | 361/698 |
| 2006/0118280 A1 * | 6/2006 | Liu | 165/104.33 |
| 2006/0162365 A1 | 7/2006 | Hoang et al. | |
| 2006/0191675 A1 | 8/2006 | Fletcher et al. | |
| 2006/0196640 A1 * | 9/2006 | Siu | 165/104.26 |
| 2007/0133173 A1 | 6/2007 | Hsiung et al. | |
| 2007/0201210 A1 | 8/2007 | Chow et al. | |
| 2007/0258213 A1 * | 11/2007 | Chen et al. | 361/701 |
| 2008/0002363 A1 | 1/2008 | Campbell et al. | |
| 2008/0225478 A1 | 9/2008 | Goettert et al. | |
| 2009/0284918 A1 | 11/2009 | Chou | |
| 2009/0284927 A1 | 11/2009 | Li et al. | |
| 2010/0326628 A1 | 12/2010 | Campbell et al. | |
| 2010/0328882 A1 | 12/2010 | Campbell et al. | |
| 2010/0328889 A1 | 12/2010 | Campbell et al. | |
| 2010/0328890 A1 | 12/2010 | Campbell et al. | |

FOREIGN PATENT DOCUMENTS

| | | |
|---|---|---|
| JP | 09-116056 A | 5/1997 |
| JP | 2002-026201 A | 1/2002 |
| TW | 319406 | 11/1997 |

OTHER PUBLICATIONS

Notice of Allowance for U.S. Appl. No. 12/491,287 (U.S. Patent Publication No. 2010/0328890 A1), dated Feb. 16, 2011.

Iyengar et al., "Apparatus and Method for Facilitating Cooling of an Electronics System", U.S. Appl. No. 11/957,619, filed Dec. 17, 2007.

Chu et al., "Energy Efficient Apparatus and Method for Cooling and Electronics Rack", U.S. Appl. No. 12/108,020, filed Apr. 23, 2008.

Campbell et al., "Suspended Integrated Manifold System with Serviceability for Large Planar Arrays of Electronic Modules", IBM Technical Disclosure, IP.com, IP.com No. IPCOM000126455D (Jul. 18, 2005).

Chee, B., "Supermicro Water Cooled Blades", Info World, Geeks in Paradise, (Mar. 5, 2008), http://weblog.infoworld.com/geeks/archives/2008/03.

Campbell et al., "Liquid Cooling Apparatus and Method of Facilitating Cooling of an Electronic System", U.S. Appl. No. 12/168,259, filed Jul. 7, 2008.

Ellsworth, Jr., et al., "System and Method for Facilitating Cooling of a Liquid-Cooled Electronics Rack", U.S. Appl. No. 11/942,207, filed Nov. 19, 2007.

Campbell et al., "Hybrid Air and Liquid Coolant Conditioning Unit for Facilitating Cooling of One or More Electronics Racks of a Dada Center", U.S. Appl. No. 11/944,680, filed Nov. 26, 2007.

Campbell et al., "Method and Apparatus for Defect Detection in a Cold Plate", U.S. Appl. No. 12/053,762, filed Mar. 24, 2008.

Campbell et al., "Cooling Apparatus and Method of Fabrication Thereof with Jet Impingement Structure Integrally Formed on Thermally Conductive Pin Fins", U.S. Appl. No. 12/141,290, filed Jun. 18, 2008.

Campbell et al., "Cooling Apparatus and Method of Fabrication Thereof with a Cold Plate Formed In Situ on a Surface to be Cooled", U.S. Appl. No. 12/143,289, filed Jun. 20, 2008.

Campbell et al., "Apparatus and Method for Facilitating Pumped Immersion-Cooling of an Electronic Subsystem", U.S. Appl. No. 12/256,628, filed Oct. 23, 2008.

Office Action for U.S. Appl. No. 12/491,287, dated Aug. 19, 2010.

Notice of Allowance for U.S. Appl. No. 12/491,289, dated Aug. 27, 2010.

Office Action for U.S. Appl. No. 12/491,281, dated Oct. 7, 2010.

Office Action for U.S. Appl. No. 12/491,287, dated Nov. 30, 2010.

* cited by examiner

CONDENSER BLOCK STRUCTURES WITH CAVITIES FACILITATING VAPOR CONDENSATION COOLING OF COOLANT

TECHNICAL FIELD

The present invention relates to heat transfer mechanisms, and more particularly, to cooling apparatuses, cooled electronic modules and methods of fabrication thereof for removing heat generated by one or more electronic devices. Still more particularly, the present invention relates to vapor condenser structures configured with cavities to enhance vapor condensation cooling of coolant employed in a cooling apparatus for cooling an electronic module, an electronic subsystem or electronics rack, such as for use in a cooled electronic module with pump-enhanced, dielectric fluid immersion-cooling of one or more heat-generating electronic devices.

BACKGROUND OF THE INVENTION

As is known, operating electronic devices produce heat. This heat should be removed from the devices in order to maintain device junction temperatures within desirable limits, with failure to remove heat effectively resulting in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic device with high power density.

The need to cool current and future high heat load, high heat flux electronic devices therefore mandates the development of aggressive thermal management techniques, using liquid cooling. Various types of liquid coolants provide different cooling capabilities. For example, fluids such as refrigerants or other dielectric liquids (e.g., fluorocarbon liquid) exhibit lower thermal conductivity and specific heat properties compared to liquids such as water or other aqueous fluids. Dielectric liquids have an advantage, however, in that they may be placed in direct physical contact with electronic devices and their interconnects without adverse affects, such as corrosion or electrical short circuits. Other cooling liquids, such as water or other aqueous fluids, exhibit superior thermal conductivity and specific heat compared with dielectric fluids. Water-based coolants, however, must be kept from physical contact with electronic devices and interconnects, since corrosion and electrical short circuit problems are otherwise likely to result.

SUMMARY OF THE INVENTION

In one aspect, the shortcomings of the prior art are overcome and additional advantages are provided through the provision of a condenser structure for facilitating cooling of an electronic device. The condenser structure includes a thermally conductive condenser block with a plurality of exposed cavities formed therein extending from a first main surface thereof towards a second main surface. The condenser block is a monolithic structure, and the first main surface of the condenser block is a coolant vapor condensate formation surface when the condenser structure is in use facilitating cooling of an electronic device. The plurality of exposed cavities extend from the first main surface into the condenser block to increase a condensation surface area of the coolant vapor condensate formation surface of the thermally conductive condenser block, and thereby facilitate coolant vapor condensation formation on the thermally conductive condenser block, and thus cooling of the electronic module using a two-phase coolant.

In a further aspect, a cooling apparatus is provided which includes a housing configured to at least partially surround and form a sealed compartment about an electronic device to be cooled, and dielectric fluid disposed within the sealed compartment. The electronic device to be cooled is at least partially immersed within the dielectric fluid. The cooling apparatus further includes a condenser structure. The condenser structure comprises a thermally conductive condenser block with a plurality of exposed cavities formed therein extending from a first main surface thereof towards a second main surface. The first main surface of the thermally conductive condenser block is exposed within the sealed compartment in an upper portion thereof, and the plurality of exposed cavities are exposed in the first main surface of the thermally conductive condenser block to increase a condensation surface area of the first main surface and thereby facilitate cooling of dielectric fluid vapor rising to the upper portion of the sealed compartment.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
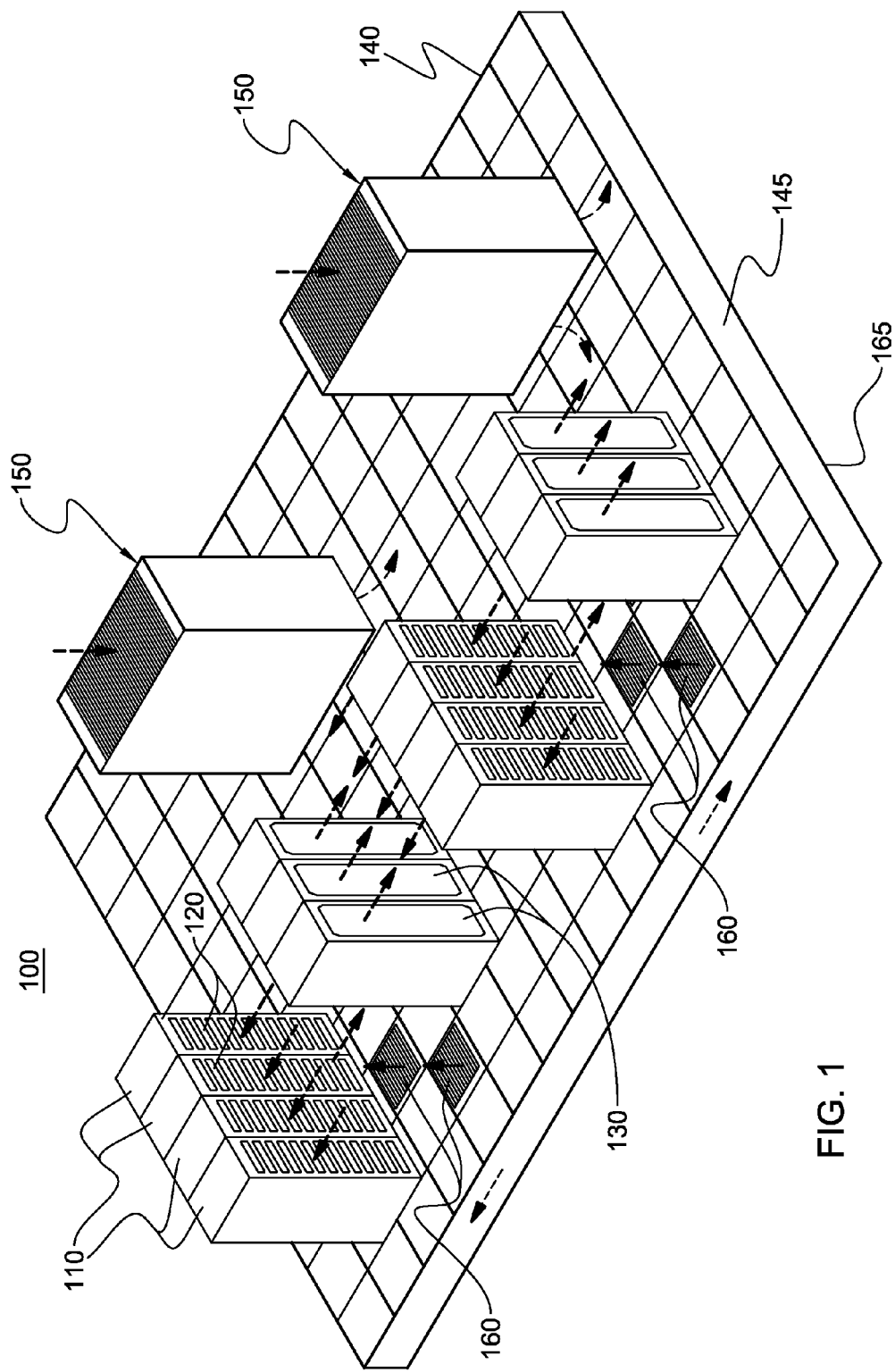
FIG. 1. depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat-generating components of a computer system or electronic system, and may be, for example, a stand alone computer processor having high, mid or low end processing capability. In one embodiment, an electronics rack may comprise multiple electronic subsystems or drawers, each having one or more heat-generating components disposed therein requiring cooling. "Electronic subsystem" refers to any sub-housing, blade, book, drawer, node, compartment, etc., having one or more heat-generating electronic devices disposed therein. Each electronic subsystem of an electronics rack may be movable or fixed relative to the electronics rack, with the rack-mounted electronics drawers and blades of a blade center system being two examples of subsystems of an electronics rack to be cooled.

"Electronic device" refers to any heat-generating electronic device of, for example, a computer system or other electronics unit requiring cooling. By way of example, an electronic device may comprise one or more integrated circuit dies (or chips) and/or other electronic devices to be cooled, including one or more processor chips, memory chips and memory support chips. As a further example, the electronic device may comprise one or more bare dies or one or more packaged dies disposed on a common carrier. As used herein, "primary heat-generating component" refers to a primary heat-generating electronic device within an electronic subsystem, while "secondary heat-generating component" refers to an electronic device of the electronic subsystem generating less heat than the primary heat-generating component to be cooled. "Primary heat-generating die" refers, for example, to a primary heat-generating die or chip within a heat-generating electronic device comprising primary and secondary heat-generating dies (with a processor die being one example). "Secondary heat-generating die" refers to a die of a multi-die electronic device generating less heat than the primary heat-generating die thereof (with memory dies and memory support dies being examples of secondary dies to be cooled). As one example, a heat-generating electronic device could comprise multiple primary heat-generating bare dies and multiple secondary heat-generating dies on a common carrier. Further, the term "cold plate" refers to any thermally conductive structure having one or more channels or passageways formed therein for flowing of coolant therethrough. In addition, "metallurgically bonded" refers generally herein to two components being welded, brazed or soldered together by any means.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units. The term "cavity" refers to any hole, discrete opening or continuous opening (such as a channel) formed within a structure, such as the thermally conductive condenser block described hereinbelow.

One example of facility coolant and system coolant is water. However, the cooling concepts disclosed herein are readily adapted to use with other types of coolant on the facility side and/or on the system side. For example, one or more of the coolants may comprise a brine, a fluorocarbon liquid, a hydrofluoroether liquid, a liquid metal, or other similar coolant, or refrigerant, while still maintaining the advantages and unique features of the present invention.

Reference is made below to the drawings, which are not drawn to scale to facilitate understanding thereof, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof This room air may comprise in part exhausted air from the "hot" aisles of the computer installation defined, for example, by opposing air outlet sides 130 of the electronics racks 110.

Figure 2:
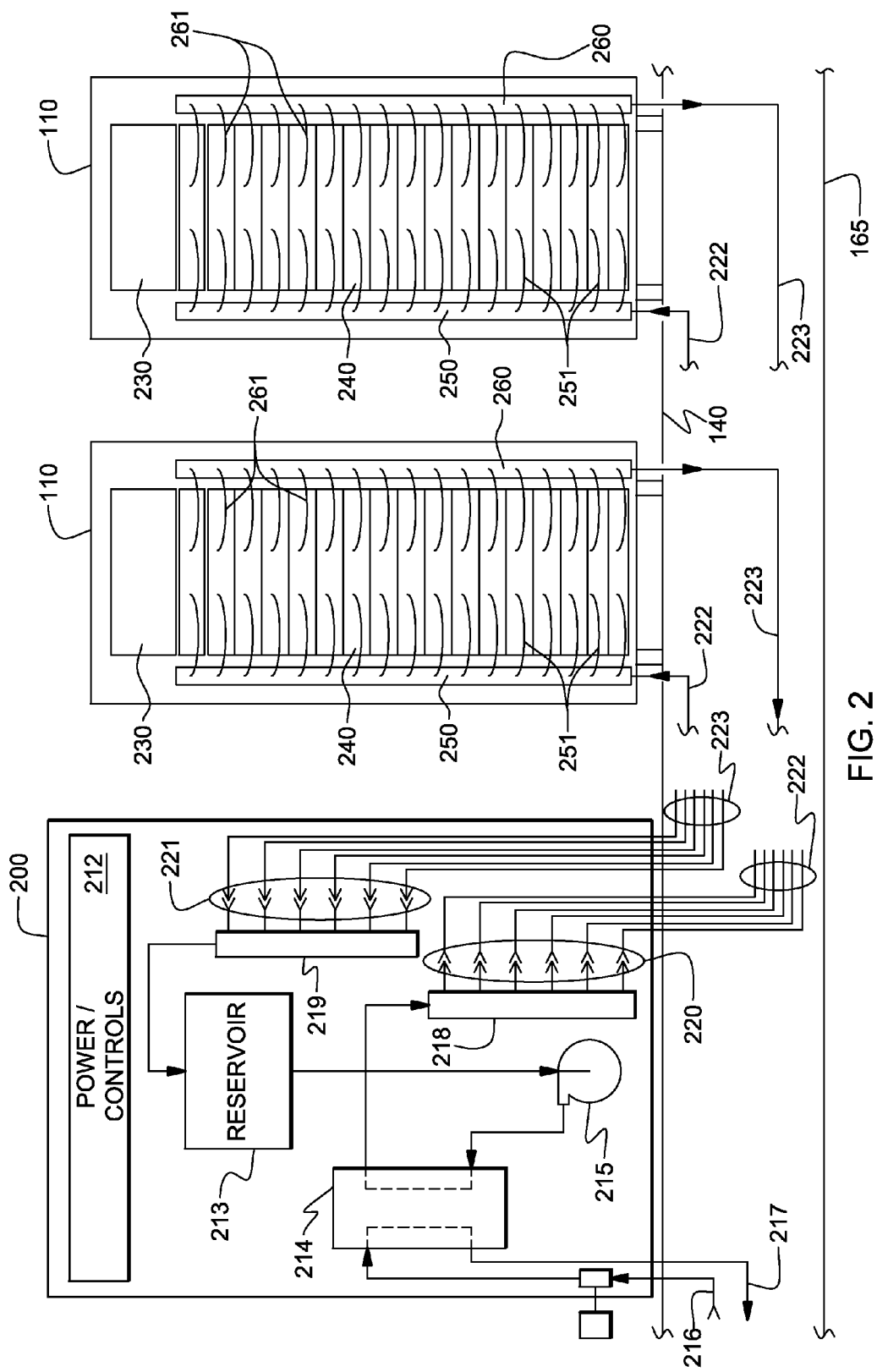
FIG. 2 depicts one embodiment of a coolant distribution unit for liquid-cooling of one or more electronics racks of a data center, in accordance with an aspect of the present invention.
Figure 3:
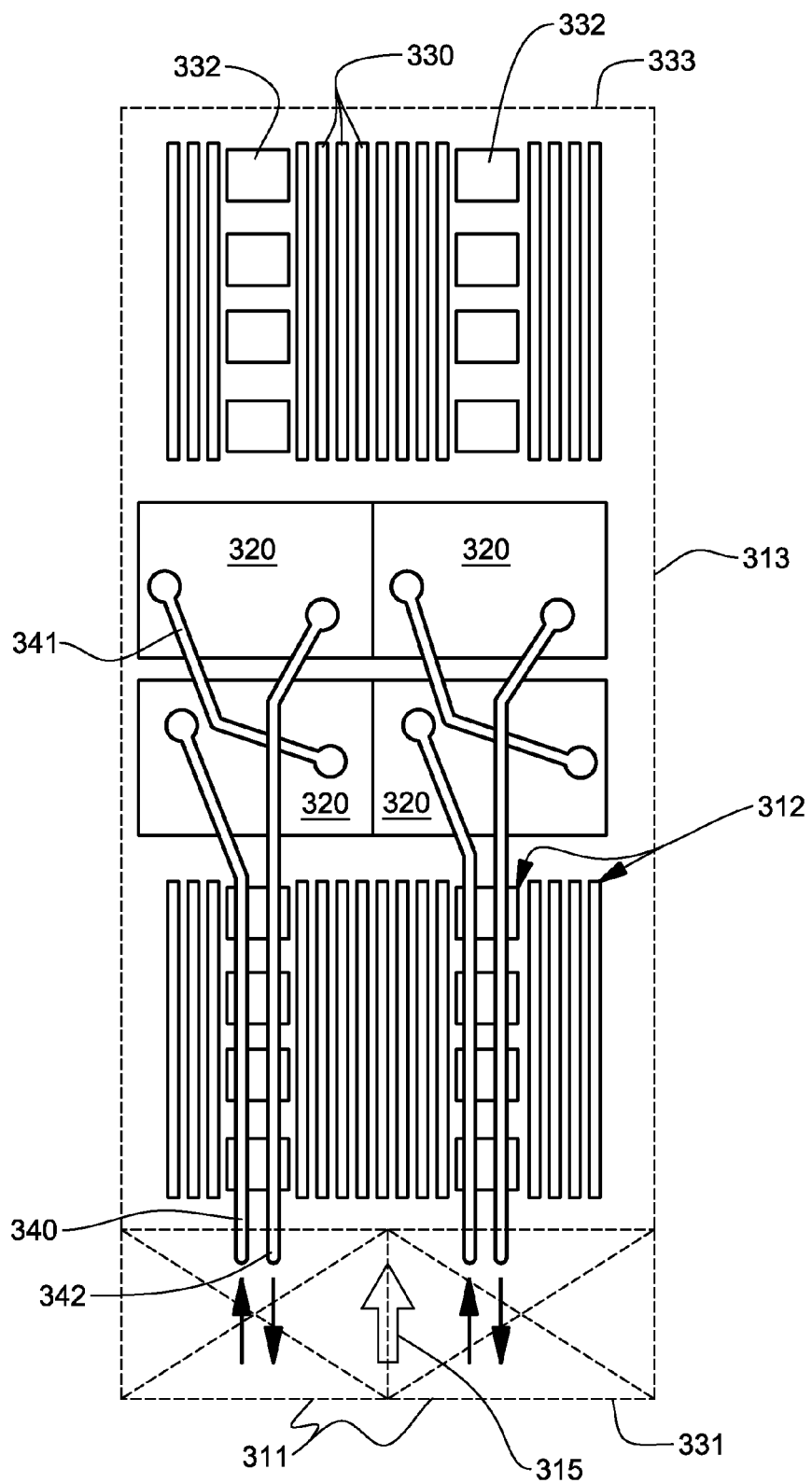
FIG. 3 is a plan view of one embodiment of an electronic subsystem layout illustrating an air and liquid cooling system for cooling components of the electronic subsystem, in accordance with an aspect of the present invention.
Figure 4:
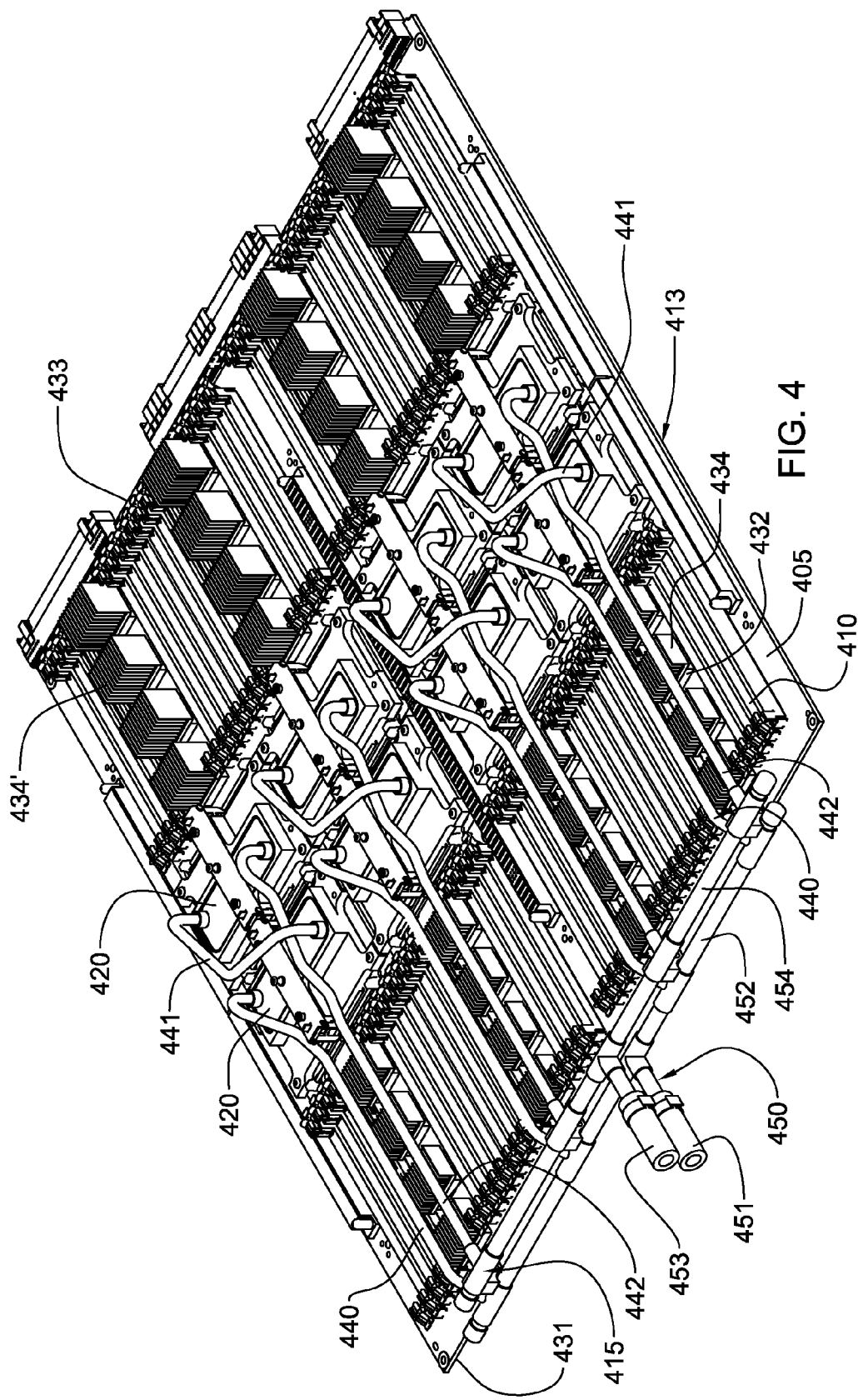
FIG. 4 depicts one detailed embodiment of a partially assembled electronic subsystem layout, wherein the electronic subsystem includes eight heat-generating electronic devices to be cooled, each having a respective cooling apparatus associated therewith, in accordance with an aspect of the present invention.

Due to the ever-increasing airflow requirements through electronics racks, and the limits of air distribution within the typical data center installation, liquid-based cooling is being combined with the conventional air-cooling. FIGS. 2-4 illustrate one embodiment of a data center implementation employing a liquid-based cooling system with one or more cold plates coupled to high heat-generating electronic devices disposed within the electronics racks.

FIG. 2 depicts one embodiment of a coolant distribution unit 200 for a data center. The coolant distribution unit is conventionally a large unit which occupies what would be considered a full electronics frame. Within coolant distribution unit 200 is a power/control element 212, a reservoir/expansion tank 213, a heat exchanger 214, a pump 215 (often accompanied by a redundant second pump), facility water inlet 216 and outlet 217 supply pipes, a supply manifold 218 supplying water or system coolant to the electronics racks 210 via couplings 220 and lines 222, and a return manifold 219 receiving water from the electronics racks 110, via lines 223 and couplings 221. Each electronics rack includes (in one example) a power/control unit 230 for the electronics rack, multiple electronic subsystems 240, a system coolant supply manifold 250, and a system coolant return manifold 260. As shown, each electronics rack 110 is disposed on raised floor 140 of the data center with lines 222 providing system coolant to system coolant supply manifolds 250 and lines 223 facilitating return of system coolant from system coolant return manifolds 260 being disposed in the supply air plenum beneath the raised floor.

In the embodiment illustrated, the system coolant supply manifold 250 provides system coolant to the cooling systems of the electronic subsystems (more particularly, to liquid-cooled cold plates thereof) via flexible hose connections 251, which are disposed between the supply manifold and the respective electronic subsystems within the rack. Similarly, system coolant return manifold 260 is coupled to the electronic subsystems via flexible hose connections 261. Quick connect couplings may be employed at the interface between flexible hoses 251, 261 and the individual electronic subsystems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 110 may also include an air-to-liquid heat exchanger disposed at an air outlet side thereof, which also receives system coolant from the system coolant supply manifold 250 and returns system coolant to the system coolant return manifold 260.

FIG. 3 depicts one embodiment of an electronic subsystem 313 component layout wherein one or more air moving devices 311 provide forced air flow 315 to cool multiple components 312 within electronic subsystem 313. Cool air is taken in through a front 331 and exhausted out a back 333 of the subsystem. The multiple components to be cooled include multiple processor modules to which liquid-cooled cold plates 320 (of a liquid-based cooling system) are coupled, as well as multiple arrays of memory modules 330 (e.g., dual in-line memory modules (DIMMs)) and multiple rows of memory support modules 332 (e.g., DIMM control modules) to which air-cooled heat sinks are coupled. In the embodiment illustrated, memory modules 330 and the memory support modules 332 are partially arrayed near front 331 of electronic subsystem 313, and partially arrayed near back 333 of electronic subsystem 313. Also, in the embodiment of FIG. 3, memory modules 330 and the memory support modules 332 are cooled by air flow 315 across the electronic subsystem.

The illustrated liquid-based cooling system further includes multiple coolant-carrying tubes connected to and in fluid communication with liquid-cooled cold plates 320. The coolant-carrying tubes comprise sets of coolant-carrying tubes, with each set including (for example) a coolant supply tube 340, a bridge tube 341 and a coolant return tube 342. In this example, each set of tubes provides liquid coolant to a series-connected pair of cold plates 320 (coupled to a pair of processor modules). Coolant flows into a first cold plate of each pair via the coolant supply tube 340 and from the first cold plate to a second cold plate of the pair via bridge tube or line 341, which may or may not be thermally conductive. From the second cold plate of the pair, coolant is returned through the respective coolant return tube 342.

FIG. 4 depicts in greater detail an alternate electronic subsystem layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is cooled and conditioned water.

FIG. 4 is an isometric view of one embodiment of an electronic subsystem or drawer, and monolithic cooling system. The depicted planar server assembly includes a multi-layer printed circuit board to which memory DIMM sockets and various electronic devices to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to facilitate cooling one or more electronic devices to which the cold plates are mechanically and thermally coupled. The number of parallel paths and the number of series-connected liquid-cooled cold plates depends, for example, on the desired device temperature, available coolant temperature and coolant flow rate, and the total heat load being dissipated from each electronic device.

More particularly, FIG. 4 depicts a partially assembled electronic subsystem 413 and an assembled liquid-based cooling system 415 coupled to primary heat-generating components (e.g., including processor dies) to be cooled. In this embodiment, the electronics system is configured for (or as) an electronics drawer of an electronics rack, and includes, by way of example, a support substrate or planar board 405, a plurality of memory module sockets 410 (with the memory modules (e.g., dual in-line memory modules) not shown), multiple rows of memory support modules 432 (each having coupled thereto an air-cooled heat sink 434), and multiple processor modules (not shown) disposed below the liquid-cooled cold plates 420 of the liquid-based cooling system 415.

In addition to liquid-cooled cold plates 420, liquid-based cooling system 415 includes multiple coolant-carrying tubes, including coolant supply tubes 440 and coolant return tubes 442 in fluid communication with respective liquid-cooled cold plates 420. The coolant-carrying tubes 440, 442 are also connected to a header (or manifold) subassembly 450 which facilitates distribution of liquid coolant to the coolant supply tubes and return of liquid coolant from the coolant return tubes 442. In this embodiment, the air-cooled heat sinks 434 coupled to memory support modules 432 closer to front 431 of electronic subsystem 413 are shorter in height than the air-cooled heat sinks 434' coupled to memory support modules 432 near back 433 of electronic subsystem 413. This size difference is to accommodate the coolant-carrying tubes 440, 442 since, in this embodiment, the header subassembly 450 is at the front 431 of the electronics drawer and the multiple liquid-cooled cold plates 420 are in the middle of the drawer.

Liquid-based cooling system 415 comprises a pre-configured monolithic structure which includes multiple (pre-assembled) liquid-cooled cold plates 420 configured and disposed in spaced relation to engage respective heat-generating electronic devices. Each liquid-cooled cold plate 420 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 420 to the associated electronic device to form the cold plate and electronic device assemblies. Alignment openings (i.e., thru-holes) are provided on the sides of the cold plate to receive alignment pins or positioning dowels during the assembly process. Additionally, connectors (or guide pins) are included within attachment subassembly which facilitate use of the attachment assembly.

As shown in FIG. 4, header subassembly 450 includes two liquid manifolds, i.e., a coolant supply header 452 and a coolant return header 454, which in one embodiment, are coupled together via supporting brackets. In the monolithic cooling structure of FIG. 4, the coolant supply header 452 is metallurgically bonded in fluid communication to each coolant supply tube 440, while the coolant return header 454 is metallurgically bonded in fluid communication to each coolant return tube 452. A single coolant inlet 451 and a single coolant outlet 453 extend from the header subassembly for coupling to the electronics rack's coolant supply and return manifolds (not shown).

FIG. 4 also depicts one embodiment of the pre-configured, coolant-carrying tubes. In addition to coolant supply tubes 440 and coolant return tubes 442, bridge tubes or lines 441 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 440, bridge tubes 441 and coolant return tubes 442 are each pre-configured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are pre-configured for a particular electronics system to facilitate installation of the monolithic structure in engaging relation with the electronics system.

Figure 5:
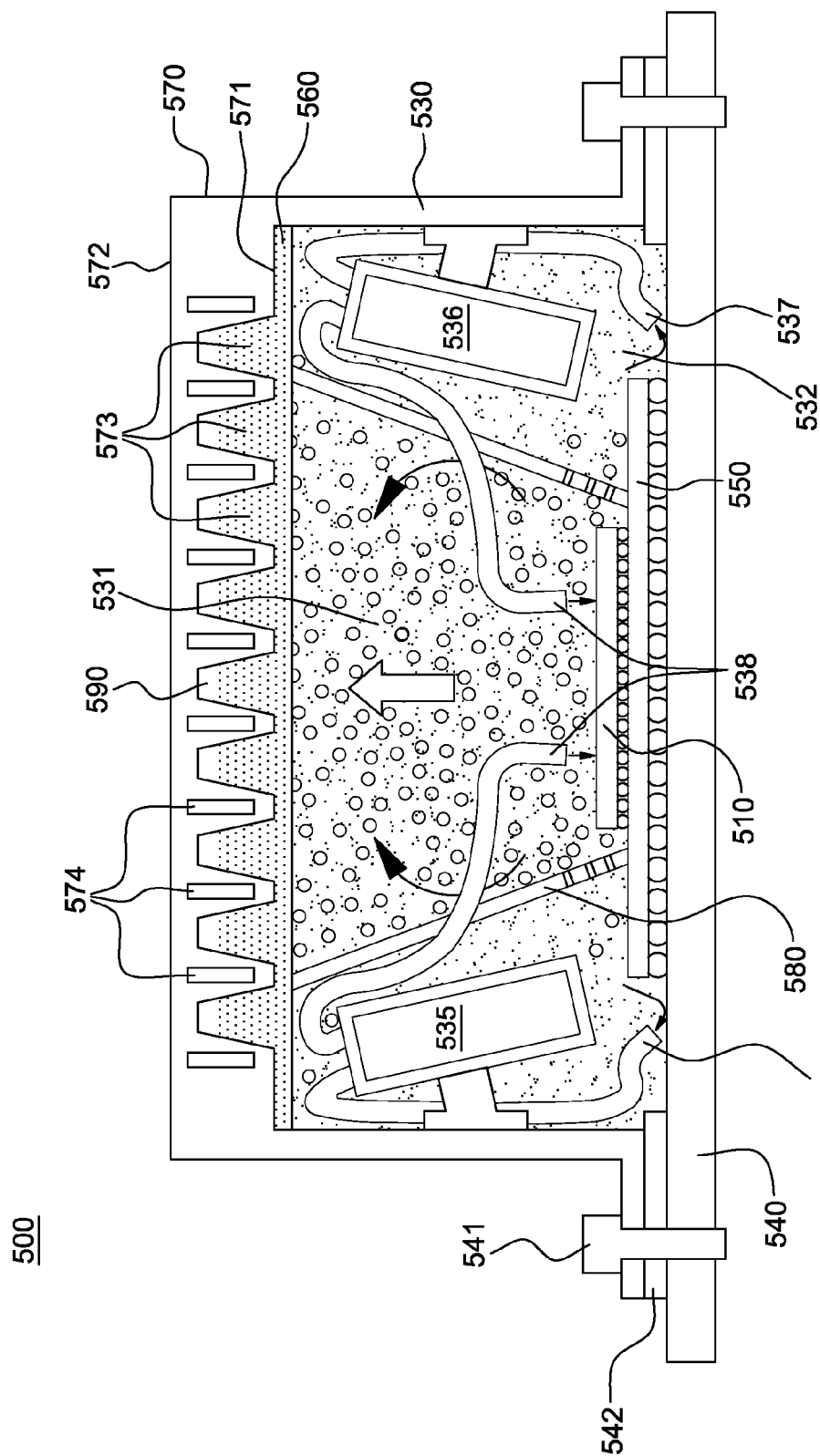
FIG. 5 is a cross-sectional elevational view of one embodiment of a cooled electronic module, in accordance with an aspect of the present invention.
Figure 6A:
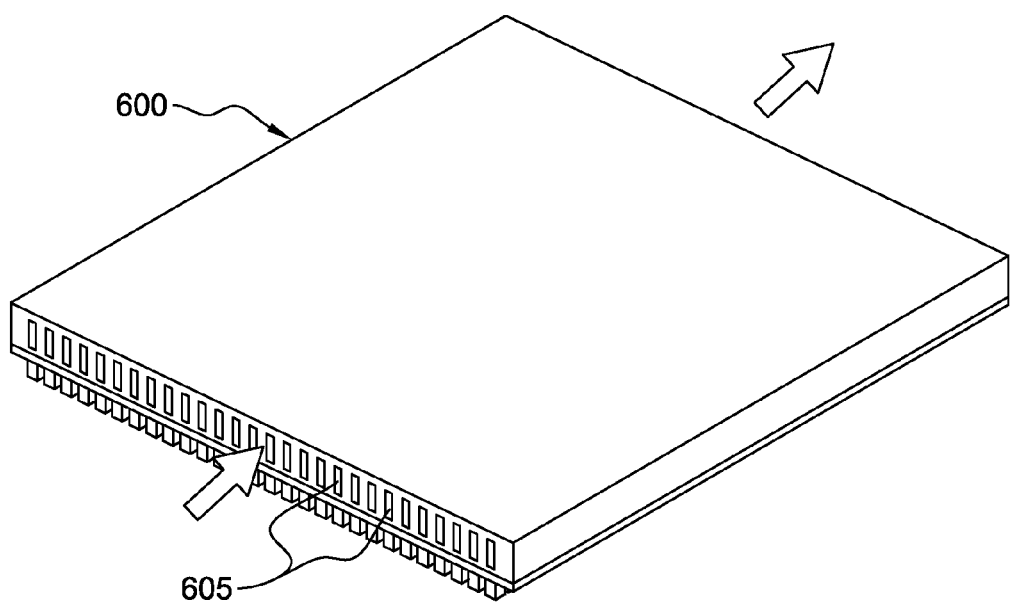
FIGS. 6A-6D depict one embodiment of a condenser structure (comprising a vapor condenser and cold plate assembly) for use with, for example, a cooled electronic module, in accordance with an aspect of the present invention.
Figure 6B:
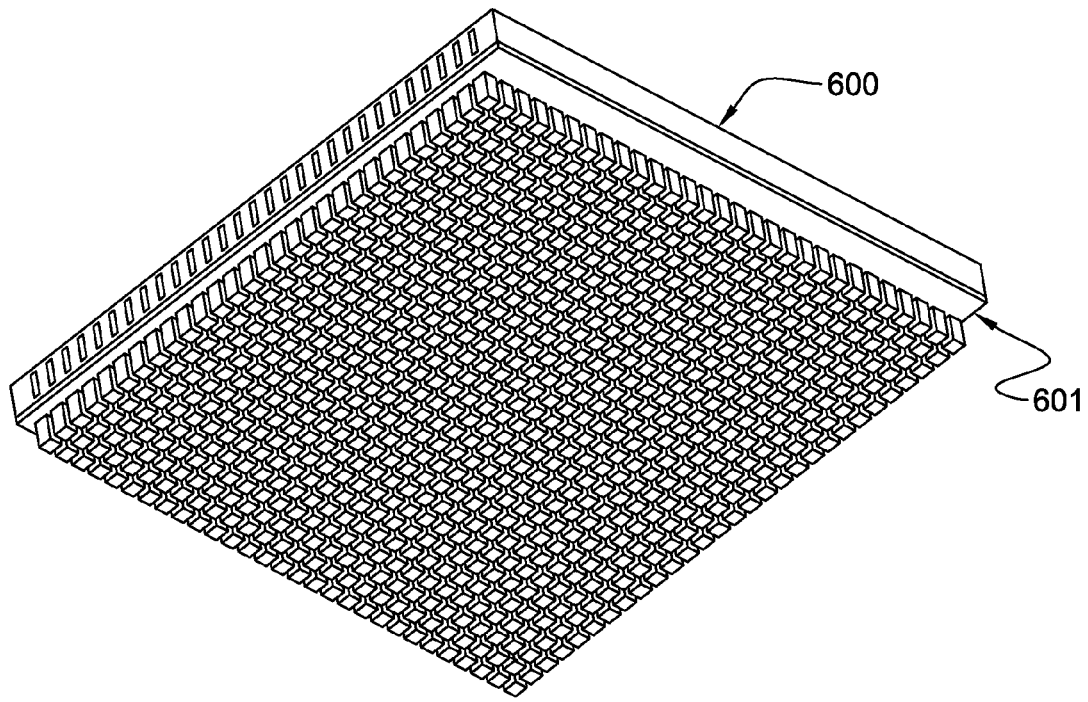
Figure 6C:
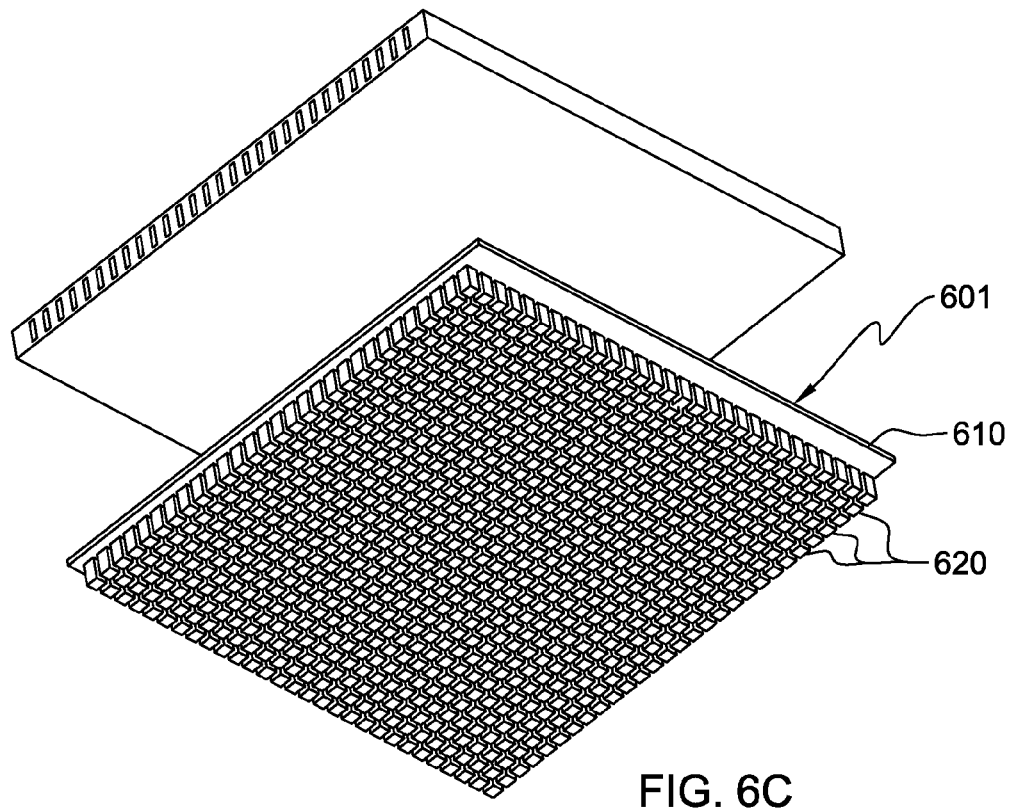
Figure 6D:
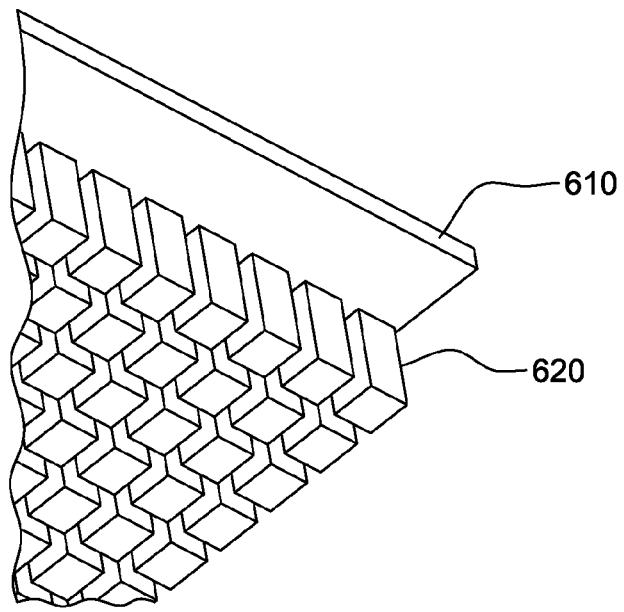

FIG. 5 depicts one embodiment of a pump-enhanced, immersion cooled electronic module 500, which is a structural and thermal interface between a heat-generating electronic device 510, such as a processor or other integrated circuit die, and an integral condenser block 570. Cooled electronic module 500 includes a module casing 530 which forms part of a housing, configured to at least partially surround and form a sealed, fluid-tight compartment 531 about electronic device 510 to be cooled. As shown, dielectric coolant 532 is disposed within sealed compartment 531, as are two impingement-cooling, immersed pumps 535, 536. Each impingement-cooling, immersed pump 535, 536 includes an inlet pump tube 537 disposed with an inlet in a lower portion of the sealed compartment for drawing liquid dielectric fluid into the pump, and a respective pump jet nozzle 538 for directing pressurized dielectric fluid towards the electronic device to be cooled to facilitate the cooling thereof By way of specific example, the impingement-cooling, immersed pumps may each be an LPD-125 liquid pump offered by AdaptivEnergy, LLC, of Hampton, Va., USA.

The housing is a shell-like component that is attached to, for example, a printed circuit board 540 using bolts or screws 541 and a sealing gasket (or o-ring) 542, which is compressed between a lower surface of the housing and an upper surface of the board, or alternatively, between a lower surface of the housing and an upper surface of a substrate 550 to which the electronic device 510 directly couples. As shown, multiple electrical connections, such as controlled collapsed chip connections (C4), electrically couple the electronic device to substrate 550, which in this embodiment is itself electrically coupled via another set of electrical connections to printed circuit board 540.

As used herein, the word "substrate" refers to any underlying supporting structure, such as substrate 550 or printed circuit board 540 to which the electronic device is coupled, and to which the housing may be sealed in order to form sealed compartment 531 about the electronic device. Sealing gasket 542 seals off the inner compartment of the housing and assists in retaining the dielectric fluid within the sealed compartment. The two impingement-cooling, immersed pumps 535, 536 are, in this embodiment, mechanically coupled to opposing side walls of the housing, and are positioned, sized and configured to force pressurized dielectric coolant towards the heat-generating electronic device to be cooled, such as a back surface of the heat-generating electronic device. This is accomplished (in one embodiment) via dual, freestanding jet nozzles 538 positioned directly over the back surface of the electronic device to be cooled. When in operation, as dielectric fluid absorbs heat, it boils undergoing a phase change from liquid phase to vapor phase, and thus its latent heat of vaporization is utilized for cooling purposes. The resultant dielectric coolant vapor rises to the upper portion of the sealed compartment and forms a dielectric vapor layer 560 in the upper portion of the sealed compartment. Vapor rises since it possesses a significantly lower density compared with the surrounding dielectric liquid. A submerged baffle (or vapor barrier) 580 facilitates directing dielectric fluid vapor upwards to the upper portion of the sealed compartment. At the upper most portion of the sealed compartment, there is illustrated a thin, non-condensable gas layer 590 comprising gases, such as air, which have also left the liquid and travel upwards. These gases can reside in solution within the dielectric fluid, but once out-gassed through the boiling process, cannot be returned to solution via a coolant condensation process.

As depicted, cooled electronic module 500 further comprises a thermally conductive condenser block 570, which forms a top wall of the housing defining the sealed compartment. In the embodiment illustrated, thermally conductive condenser block 570 includes a first main surface 571 and a second main surface 572 in opposing relation. First main surface 571 is exposed to coolant vapor 560 within the sealed compartment 531, and thus, is the coolant vapor condenser surface of the thermally conductive condenser block. A plurality of exposed cavities 573 (such as conical-frustum cavities) are defined within the thermally conductive condenser block extending from first main surface 571 towards second main surface 572. The exposed cavities are configured to increase the condensation surface area of the condenser surface of the thermally conductive condenser block to facilitate enhanced condensation of the coolant vapor on the condenser block, and thus cooling of the electronic device using a two-phase coolant, such as the above-noted two-phase dielectric fluid. The thermally conductive condenser block is cooled, in part, by means of thermal conduction coupling to coolant (such as water) flowing through a plurality of coolant-carrying channels 574 formed integrally within the condenser block itself (in the embodiment illustrated). With operation of the heat-generating electronic device, coolant is pumped through the plurality of coolant-carrying channels 574 to facilitate vapor condensate formation on the surfaces of the condenser block exposed to the dielectric coolant vapor within the sealed compartment. In one embodiment, the condenser block is an integral, monolithic structure formed from a single block of thermally conductive material. In one embodiment, the plurality of exposed cavities are appropriately configured and sized to achieve the desired extent of vapor condensate formation in the upper portion of the sealed compartment with operation of the heat-generating electronic device.

Upon reaching the upper portion of the sealed compartment, the dielectric fluid vapor contacts the cool surfaces of the condenser block, which are cooled, for example, by means of thermal conduction and convection coupling to system coolant passing through the plurality of coolant-carrying channels. By making contact with the cool, condenser block surfaces, the dielectric fluid vapor undergoes a second phase change process condensing from vapor to liquid state, and the liquid droplets fall back downward due to gravity and their relatively higher density compared with the neighboring vapor region.

Continuing with FIG. 5, dielectric liquid in the lower portion of the sealed compartment is simultaneously being drawn into the low pressure side of the immersed pumps 535, 536 via the inlet pump tubing 537. Note that the submerged baffle is configured to function to partially isolate the vapor rich region near the electronic device from the liquid (condensate) rich region near the pump inlet tube openings. The baffle 580 may include openings in its lower portion to allow the dielectric fluid to find its own common level within the sealed compartment. As long as the boiling and condensation cooling processes are in equilibrium and are commensurate with heat generated by the electronic device to be cooled, the electronic module will successfully transport heat from the electronic device to the cold plate, maintaining steady state temperature throughout.

The coolant employed within the dielectric module is a dielectric fluid so as not to cause a short circuit of electrical current on the various exposed parts of the electronic device and substrate. Many dielectric fluids are commercially available and may be used in the cooled electronic module configuration described herein. Examples include the Novec fluids, manufactured by 3M Corporation (e.g., FC-72, FC-86, HFE-7000 and HFE-7200). Those skilled in the art should note that in addition to the cooling taking place from the electronic device due to the impinging dielectric fluid, there is also heat transfer occurring from the substrate and any other component within the enclosure which generates heat. It should also be noted that the cooled electronic module embodiment of FIG. 5 employs two immersed pumps for redundancy, in the event of a single pump failure. Other configurations may employ only one pump, or even more than two pumps if desired.

Further details and variations on a pump-enhanced, immersion-cooled electronic module such as depicted in FIG. 5 are disclosed in co-filed U.S. patent application Ser. No. 12/491,281, entitled "Cooled Electronic Module with Pump-Enhanced, Dielectric Fluid-Immersion Cooling", and co-filed U.S. patent application Ser. No. 12/491,286, entitled "Condenser Fin Structures Facilitating Vapor Condensation Cooling of Coolant", and co-filed U.S. patent application Ser. No. 12/491 287, entitled "Condenser Structures with Fin Cavities Facilitating Vapor Condensation Cooling of Coolant", and co-filed U.S. patent application Ser. No. 12/491,289, entitled "Direct Jet Impingement-Assisted Thermosyphon Cooling Apparatus and Method", the entirety of each of which is hereby incorporated herein by reference.

FIGS. 6A-10B depict further details and variations on the vapor condenser structure described above in connection with FIG. 5. In FIGS. 7A-10B embodiments, a vapor condenser block is provided as part of the condenser structure. Various embodiments of a thermally conductive condenser structure, in accordance with an aspect of the present invention, are illustrated. By way of example, the condenser structure may include, in addition to the condenser block, a cold plate block which is stacked on the condenser block to form an assembled thermally conductive condenser structure. Alternatively, the condenser block may be an integral condenser block having a plurality of coolant-carrying channels formed therein for carrying coolant therethrough to facilitate cooling of the condenser block, and thereby facilitate coolant vapor condensate formation on the condenser surface of the condenser block. Condensation formation is further facilitated by the provision of a plurality of exposed cavities in the condenser block, that is, exposed to the coolant vapor to undergo condensation on the condenser surface of the condenser block.

By way of comparison, FIGS. 6A-6D depict one embodiment of a condenser structure, which could alternatively be used in place of condenser structure 570 of the cooled electronic module depicted in FIG. 5. As illustrated, the condenser structure includes a vapor condenser 601 and a cold plate block 600. Cold plate block 600 includes a plurality of internal coolant-carrying channels 605 which facilitate the flow of coolant through the cold plate block for cooling the block, and hence the vapor condenser 601 physically and thermally coupled thereto. In this embodiment, vapor condenser 601 includes a thermally conductive base structure 610 and a plurality of thermally conductive condenser fins 620 extending therefrom in a direction parallel to gravity. The condenser fins are illustrated (by way of example only) to be square-shaped, solid pin-fin protrusions from the thermally conductive base structure 610. Each pin-fin has four rectangular vertical surfaces on which vapor can condense and flow downwards. A drawback of this design is the relatively large height it requires in order to achieve a desired condenser surface area, and the conduction resistance between the two surfaces in contact with the two coolants, that is, the coolant flowing through the plurality of coolant-carrying channels, and the vaporized coolant to be condensed.

Figure 7A:
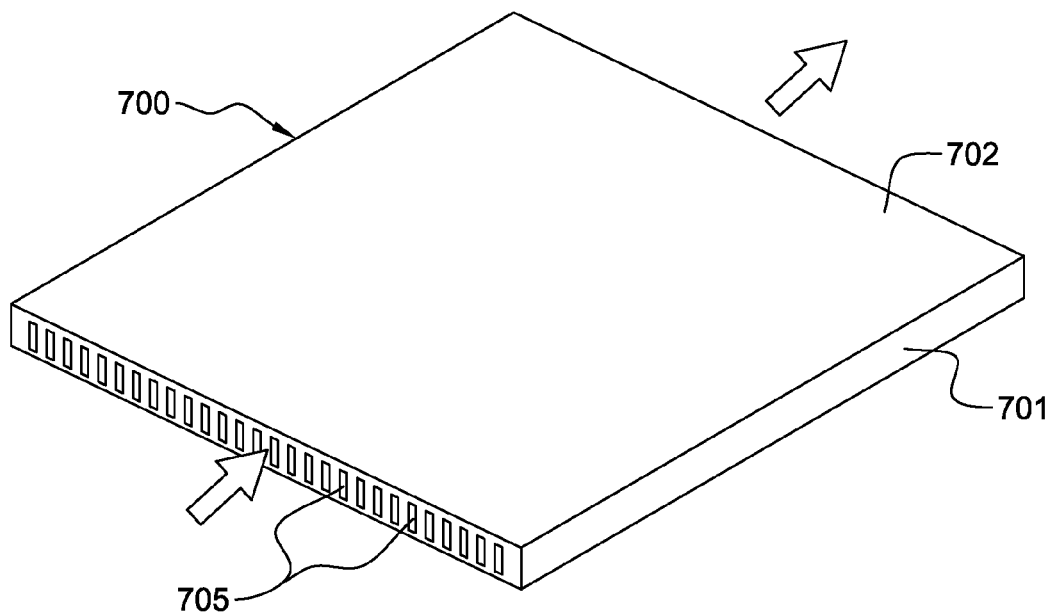
FIGS. 7A-7C depict an alternate embodiment of an condenser structure for, for example, a cooled electronic module such as depicted in FIG. 5, in accordance with an aspect of the present invention.
Figure 7B:
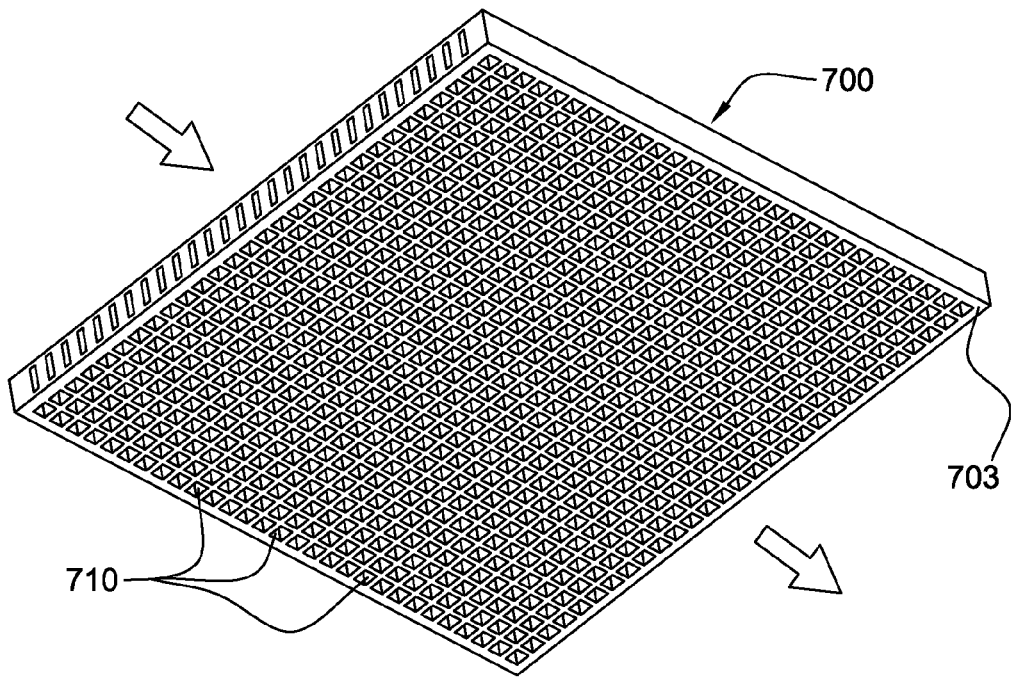
Figure 7C:
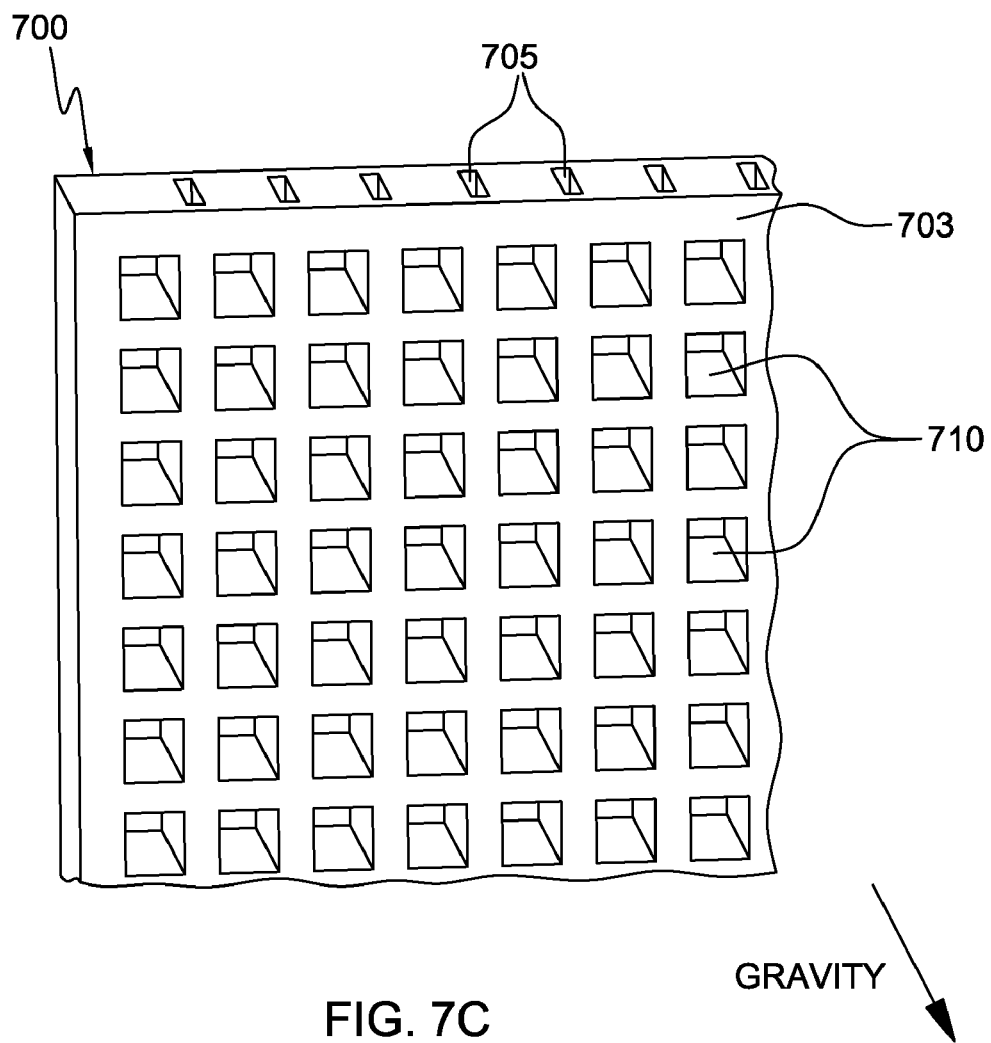

FIGS. 7A-7C depict in greater detail a thermally conductive condenser structure 700, similar to thermally conductive condenser structure 570 discussed above in connection with the cooled electronic module of FIG. 5. As illustrated, thermally conductive condenser structure 700 is an integral condenser block 701 comprising a first main surface 703 and a second main surface 702. Condenser block 701 also includes a plurality of exposed cavities 710 formed in first main surface 703 thereof and oriented in a direction parallel with gravity. In one embodiment, the plurality of exposed cavities are a plurality of pyramid-frustum cavities having a rectangular transverse cross-section. These exposed cavities are configured and sized to define a greater condensation surface area for vapor to condense. The condenser block 701 further includes a plurality of coolant-carrying channels 705 formed therein which facilitate coolant flow through the structure and therefore facilitate cooling of the condenser surfaces. In the illustrated embodiment, the plurality of coolant-carrying channels 705 extending through the condenser block are disposed parallel to each other and interdigitated with the plurality of cavities 710 extending into the condenser block.

The resultant structure is a compact, frustum cavity-based integral condenser structure that has a condensation heat transfer area by means of the inner, exposed surfaces of the cavities that have been sunk into the lower surface of the condenser block. These cavities are frustum-shaped, in one embodiment, to provide a surface that increases in area with increasing distance away from the tops of the cavities. The beneficial result of such a cavity is that the condensate film over the entire inner surface of each cavity will remain relatively thin, and will not grow thicker in regions further from the top of the cavity. This occurs even though the volume of the condensate liquid increases along the length of the cavity wells with increasing distance away from the cavity top, since the growing volume of liquid spreads itself over a larger and larger condensation surface area of the cavity. Thus, the resulting globally thin condensate film yields a globally higher condensation heat transfer coefficient due to the low thermal resistance across the thin film (compared to a larger thermal resistance across a thicker condensate film).

The frustum shape of the cavities is shown in FIG. 7C, which displays an enlarged view of part of the underside of the integral condenser structure. FIG. 7B illustrates the entire underside structure, and FIG. 7A is an isometric view of the top of the integral condenser structure. While the cavities are not visible in FIG. 7A, the coolant-carrying channels 705 through which the secondary coolant flows can be seen. In contrast with the design of FIGS. 6A-6D, the embodiment of FIGS. 7A-7C comprises a single block that contains both the secondary coolant flow channels and the exposed frustum cavities for enhanced vapor condensation surface area. This integral condenser structure has a smaller height, and also minimizes the conduction resistance (i.e., thermal resistance) to heat transfer in the solid material between the cavities and coolant within the channels.

Advantageously, there are numerous novel aspects to the structure depicted in FIGS. 7A-7C. These include: the use of cavities to create a heat transfer surface area for vapor condensation, meaning that there is a solid material available between vapor condensation surfaces; the use of a frustum-shaped profile for the cavity, which maximizes the condensation heat transfer coefficient; and the integration of the coolant-carrying flow channels into the condenser block, wherein the use of cavities (instead of projecting fins) facilitates this feature.

Figure 8A:
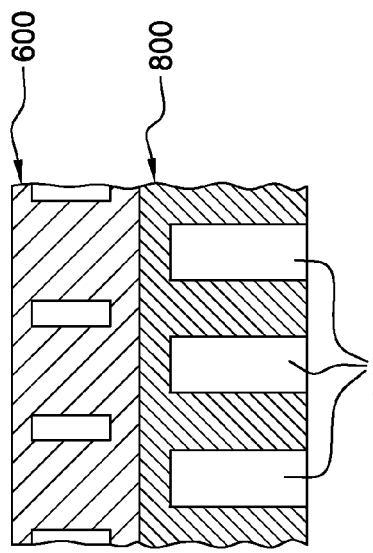
FIG. 8A is a partial cross-sectional elevational depiction of the condenser structure of FIGS. 6A-6D, in accordance with an aspect of the present invention.
Figure 8B:
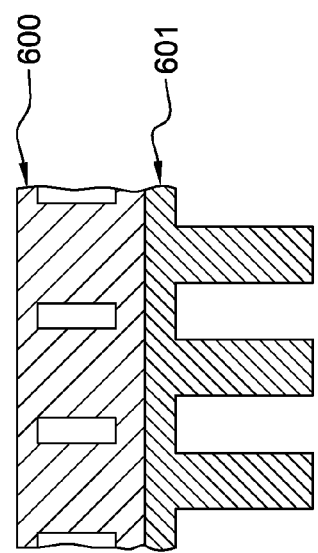
FIG. 8B is a partial cross-sectional elevational depiction of an alternate embodiment of a condenser structure, in accordance with an aspect of the present invention.

FIG. 8A is a partial cross-sectional elevational depiction of the condenser structure of FIGS. 6A-6D, while FIGS. 8B-8E depict various enhanced condenser structures, in accordance with aspects of the present invention. As illustrated in FIG. 8A, the condenser structure shown includes a vapor condenser 601 and a cold plate block 600, as described above. In FIG. 8B, a condenser structure is shown which includes cold plate block 600 coupled to a condenser block 800. Within condenser block 800, a plurality of exposed cavities 810 (such as a plurality of cylindrical cavities) are formed to provide the primary condensation heat transfer surfaces. In the embodiment of FIG. 8B, the condenser block and the cold plate block are two separate thermally conductive pieces, which are physically stacked together to achieve the condenser structure illustrated.

Figure 8E:
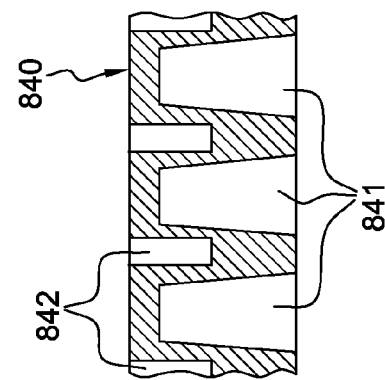
FIG. 8E is a partial cross-sectional elevational depiction of the condenser structure of FIGS. 7A-7C, in accordance with an aspect of the present invention.
Figure 8D:
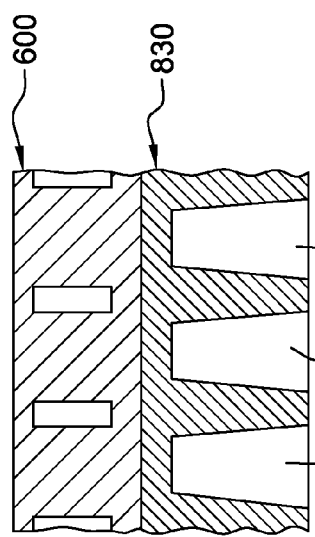
FIG. 8D is a partial cross-sectional elevational depiction of another embodiment of a condenser structure, in accordance with an aspect of the present invention.
Figure 8C:
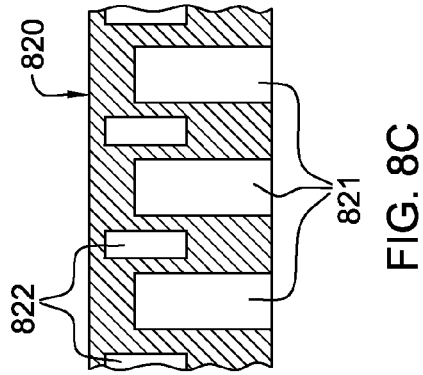
FIG. 8C is a partial cross-sectional elevational depiction of one embodiment of a condenser structure comprising an integral condenser block, in accordance with an aspect of the present invention.

FIG. 8C illustrates one embodiment of an integral condenser structure comprising an integral condenser block 820 which includes a plurality of cavities 821 formed therein extending from a first main surface towards a second main surface thereof. Additionally, a plurality of coolant-carrying channels 822 are defined within the integral condenser block 820 in an interdigitated manner with the plurality of exposed cavities 821, which in one embodiment, are a plurality of straight cylindrical-shaped cavities.

FIG. 8E illustrates another integral condenser structure wherein the integral condenser block 840 includes a plurality of conical frustum cavities 841 extending from a first main surface thereof towards a second main surface. Further, the plurality of coolant-carrying channels 842 are interdigitated with the plurality of cavities 841. In FIG. 8D, the condenser structure includes a separate cold plate block 600 physically stacked on a condenser block 830, which includes a plurality of conical frustum cavities 831 extending therein from a first main surface of the block. Note that with the integral condenser structures of FIGS. 8C & 8E, the interdigitated coolant-carrying channels 822, 842, respectively, do not fully overlap with the plurality of exposed cavities 821, 841, respectively. This may be advantageous from a structural rigidity viewpoint.

To verify performance of the condenser structures illustrated in FIGS. 8A-8E, thermal modeling was performed on the structures. A numerical cell of 9 mm×3 mm footprint was used to represent a larger vapor condenser that is 90 mm×90 mm. The condenser material was assumed to be aluminum, and the dielectric coolant was assumed to be HFE-7000, which is a coolant manufactured by 3M Corporation. For the illustrated structures of FIGS. 8A-8E, the diameter of the condensation surface (pins or cavities) was 2 mm at the very top where the surface meets the condenser base. The surface (pins or cavities) height was 5 mm, whether for the solid pins (FIG. 8A) or the cavity embodiments (FIGS. 8B-8E). The secondary coolant was assumed to be water flowing through a copper block with several 0.5 mm×2 mm flow channels. The water flow rate was assumed to be 0.25 GPM for the 90 mm×90 mm condenser structure, and was supplied at 18° C. Known correlations from literature were utilized to calculate the local fin heat transfer coefficient along the length of the fins, as well as the illustrated cavities. For the frustum cavity embodiments illustrated in FIGS. 8C & 8E, the divergence of the cavity, that is, the increase in its diameter, was determined using the calculated thickness of the condensate film at a particular point. The divergence of the cavity was made equal to the increase in condensate film growth, as per the calculations, which were carried for vertical, downward-facing surfaces immersed in vapor of the HFE-7000 dielectric coolant produced by 3M Corporation. The calculations used correlations known in the literature that allow for the estimation of the condensation film thickness growth on vertical surfaces. Specific equations used were from Rohsenow & Choi, Printice Hall Publications (1961), and utilized the coolant properties, the temperature difference between the solid surface and the saturated coolant vapor, and the vertical distance from the point of inception of condensation as input parameters to calculate the condensate film thickness and local heat transfer coefficient. The saturated vapor temperature and atmospheric conditions for the coolant (i.e., HFE-7000) is 34° C., and the temperature difference between the vertical surface and the surrounding vapor was assumed to be 14° C.

Figure 9:
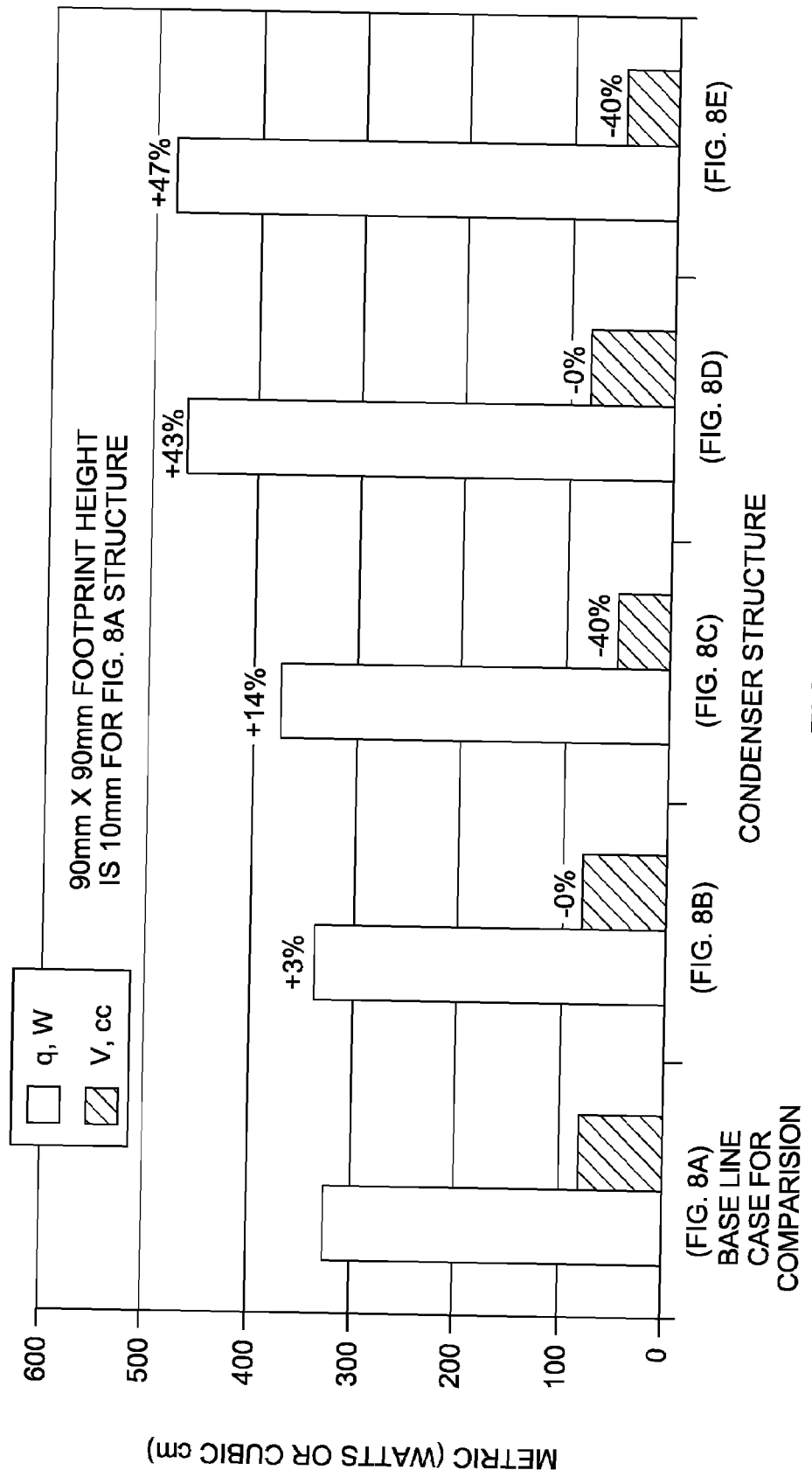
FIG. 9 is a graph depicting thermal modeling results for the structures of FIGS. 8A-8E, comparing heat dissipation and volume occupied by the condenser block and cold plate of the illustrated condenser structures, in accordance with an aspect of the present invention.

FIG. 9 graphically depicts the results of the thermal modeling analysis for the structures depicted in FIGS. 8A-8E, and described above. The results show improvements in heat transfer rates over the condenser structure of FIG. 8A of 3%, 14%, 43% and 47%, respectively, for the structures depicted in FIGS. 8B-8E. Also, the two integral condenser structure embodiments illustrated in FIGS. 8C & 8E occupied 40% less volume for the condenser block. Thus, the integral condenser structures disclosed herein offer a promising alternative to the solid pin-fin design, described above in connection with FIGS. 6A-6D & 8A.

Figure 10A:
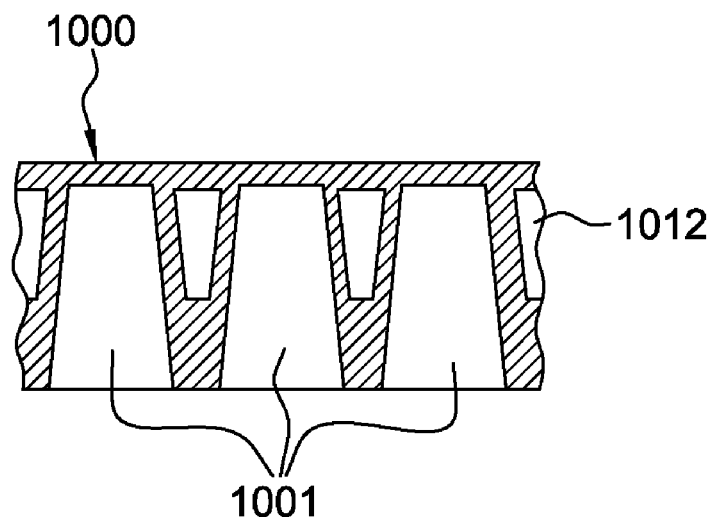
FIG. 10A is a partial cross-sectional elevational depiction of another embodiment of a condenser structure comprising an integral condenser block, in accordance with an aspect of the present invention.
Figure 10B:
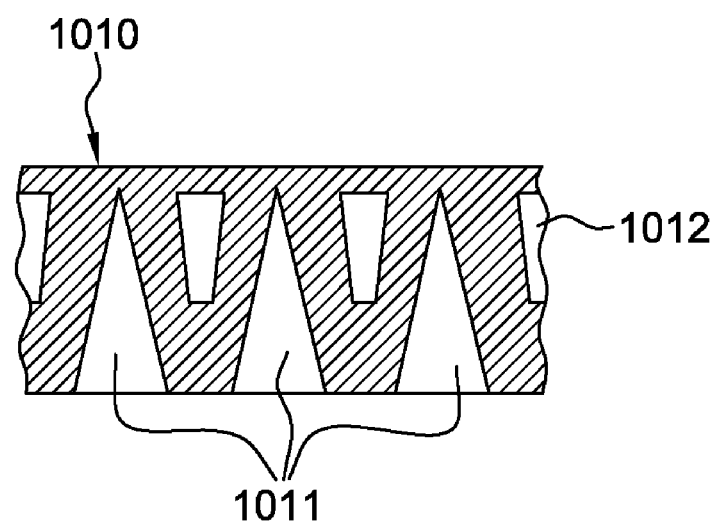
FIG. 10B is a partial cross-sectional elevational depiction of a further embodiment of a condenser structure comprising an integral condenser block, in accordance with an aspect of the present invention.

FIGS. 10A & 10B depict two further variations on an integral condenser structure, in accordance with an aspect of the present invention. In FIG. 10A, an integral condenser structure 1000 is illustrated comprising a thermally conductive structure having a plurality of conical frustum cavities 1001 formed therein extending from a first main surface towards a second main surface. Additionally, a plurality of trapezoidal-shaped, coolant-carrying flow channels 1012 are provided within the condenser structure interdigitated with the conical frustum cavities 1001. In this embodiment, the cavities and the coolant-carrying channels fully overlap with each other, resulting in an even more compact condenser design.

In FIG. 10B, another variation of an integral condenser structure 1010 is illustrated. In this embodiment, a thermally conductive structure is disclosed which includes a plurality of conical cavities 1011 extending from a first main surface thereof towards a second main surface. Also embedded within the condenser structure, that is, within the condenser block (in this embodiment), are a plurality of coolant-carrying channels 1012, which are illustrated to be inverted, trapezoidal-shaped coolant flow channels. In contrast to the cavities of FIG. 10A, the cavities in FIG. 10B are full cone-shaped cavities (which are illustrated by way of example only).

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A condenser structure for facilitating cooling of an electronic device comprising:
   a thermally conductive condenser block with a plurality of exposed cavities formed therein extending from a first main surface thereof towards a second main surface, wherein at least one exposed cavity of the plurality of exposed cavities has a varying cross-sectional area from the first main surface of the thermally conductive condenser block towards the second main surface thereof; and
   wherein the condenser block is a monolithic structure, and the first main surface thereof is a coolant vapor condensate formation surface when the condenser structure is facilitating cooling of an electronic device, the plurality of exposed cavities increasing a condensation surface area of the coolant vapor condensate formation surface of the thermally conductive condenser block, thereby facilitating coolant vapor condensate formation on the thermally conductive condenser block, and thus cooling of the electronic device using a two-phase coolant.

2. The condenser structure of claim 1, further comprising a thermally conductive cold plate block coupled in stacked relation to the thermally conductive condenser block, the thermally conductive cold plate block comprising a plurality of coolant-carrying channels extending therein.

3. The condenser structure of claim 2, wherein the plurality of coolant-carrying channels in the thermally conductive cold plate block of the stacked, thermally conductive cold plate block and thermally conductive condenser block are vertically offset from the plurality of exposed cavities in the thermally conductive condenser block.

4. The condenser structure of claim 1, wherein the at least one exposed cavity is defined by an inner surface of the thermally conductive condenser block, and wherein the inner surface diverges from an end of the at least one exposed cavity closest to the second main surface to the first main surface of the thermally conductive condenser block.

5. The condenser structure of claim 4, wherein the diverging inner surface of the at least one exposed cavity reduces a thickness of coolant condensate film forming thereon in a region adjacent to the first main surface.

6. The condenser structure of claim 1, wherein the thermally conductive condenser block is an integral condenser block which further comprises a plurality of coolant-carrying channels, the plurality of coolant-carrying channels residing within the integral condenser block.

7. The condenser structure of claim 1, wherein the plurality of exposed cavities within the thermally conductive condenser block are one of a plurality of conical-frustum cavities or a plurality of conical cavities.

8. A condenser structure for facilitating cooling of an electronic device comprising:
   a thermally conductive condenser block with a plurality of exposed cavities formed therein extending from a first main surface thereof towards a second main surface;
   wherein the condenser block is a monolithic structure, and the first main surface thereof is a coolant vapor condensate formation surface when the condenser structure is facilitating cooling of an electronic device, the plurality of exposed cavities increasing a condensation surface area of the coolant vapor condensate formation surface of the thermally conductive condenser block, thereby facilitating coolant vapor condensate formation on the thermally conductive condenser block, and thus cooling of the electronic device using a two-phase coolant;
   wherein the thermally conductive condenser block is an integral condenser block which further comprises a plurality of coolant-carrying channels, the plurality of coolant-carrying channels residing within the integral condenser block; and
   wherein the plurality of coolant-carrying channels within the integral condenser block are interdigitated with the plurality of exposed cavities extending therein from the first main surface.

9. The condenser structure of claim 8, wherein at least one exposed cavity of the plurality of exposed cavities has a varying cross-sectional area from an end thereof closest to the second main surface of the integral condenser block to the first main surface thereof, the varying cross-sectional area being defined by an inner surface of the integral condenser block which diverges from the end of the at least one exposed cavity closest to the second main surface of the integral condenser block to the first main surface thereof.

10. The condenser structure of claim 9, wherein the plurality of coolant-carrying channels comprise a plurality of trapezoidal-shaped cavities disposed within the integral condenser block.

11. A cooling apparatus comprising:
a housing configured to at least partially surround and form a sealed compartment about an electronic device to be cooled;
a dielectric fluid disposed within the sealed compartment, wherein the electronic device to be cooled is at least partially immersed within the dielectric fluid; and
a condenser structure, the condenser structure comprising a thermally conductive condenser block with a plurality of exposed cavities formed therein extending from a first main surface thereof towards a second main surface, the first main surface of the thermally conductive condenser block being exposed within the sealed compartment in an upper portion thereof, wherein at least one exposed cavity of the plurality of exposed cavities has a varying cross-sectional area from the first main surface of the thermally conductive condenser block towards the second main surface thereof; and wherein the plurality of exposed cavities are exposed in the first main surface of the thermally conductive condenser block to increase a condensation surface area of the first main surface and thereby facilitate cooling of dielectric fluid vapor rising to the upper portion of the sealed compartment.

12. The cooling apparatus of claim 11, further comprising a thermally conductive cold plate block coupled in stacked relation to the thermally conductive condenser block, the thermally conductive cold plate block comprising a plurality of coolant-carrying channels extending therein.

13. The cooling apparatus of claim 12, wherein the plurality of coolant-carrying channels in the thermally conductive cold plate block of the stacked, thermally conductive cold plate block and thermally conductive condenser block are vertically offset from the plurality of exposed cavities in the thermally conductive condenser block.

14. The cooling apparatus of claim 11, wherein the thermally conductive condenser block is an integral condenser block which further comprises a plurality of coolant-carrying channels, the plurality of coolant-carrying channels residing within the integral condenser block.

15. The cooling apparatus of claim 11, wherein the plurality of exposed cavities within the thermally conductive condenser block are one of a plurality of conical-frustum cavities or a plurality of conical cavities.

16. A cooling apparatus comprising:
a housing configured to at least partially surround and form a sealed compartment about an electronic device to be cooled;
a dielectric fluid disposed within the sealed compartment, wherein the electronic device to be cooled is at least partially immersed within the dielectric fluid;
a condenser structure, the condenser structure comprising a thermally conductive condenser block with a plurality of exposed cavities formed therein extending from a first main surface thereof towards a second main surface, the first main surface of the thermally conductive condenser block being exposed within the sealed compartment in an upper portion thereof, wherein the plurality of exposed cavities are exposed in the first main surface of the thermally conductive condenser block to increase a condensation surface area of the first main surface and thereby facilitate cooling of dielectric fluid vapor rising to the upper portion of the sealed compartment;
wherein the thermally conductive condenser block is an integral condenser block which further comprises a plurality of coolant-carrying channels, the plurality of coolant-carrying channels residing within the integral condenser block; and
wherein the plurality of coolant-carrying channels within the integral condenser block are interdigitated with the plurality of exposed cavities extending therein from the first main surface.

17. The cooling apparatus of claim 16, wherein at least one exposed cavity of the plurality of exposed cavities has a varying cross-sectional area from an end thereof closest to the second main surface of the integral condenser block to the first main surface thereof, the varying cross-sectional area being defined by an inner surface of the integral condenser block which diverges from the end of the at least one exposed cavity closest to the second main surface of the integral condenser block to the first main surface thereof.

18. The cooling apparatus of claim 17, wherein the plurality of coolant-carrying channels comprise a plurality of trapezoidal-shaped cavities disposed within the integral condenser block.

* * * * *